United States Patent
Hsieh (10) Patent No.: US 8,164,139 B2
(45) Date of Patent: Apr. 24, 2012

(54) MOSFET STRUCTURE WITH GUARD RING

(75) Inventor: Fu-Yuan Hsieh, Hsinchu (TW)

(73) Assignee: Force MOS Technology Co., Ltd., Hsinchu (TW)

( * ) Notice: Subject to any disclaimer, the term of this patent is extended or adjusted under 35 U.S.C. 154(b) by 126 days.

(21) Appl. No.: 12/822,715

(22) Filed: Jun. 24, 2010

(65) Prior Publication Data

US 2010/0258856 A1     Oct. 14, 2010

Related U.S. Application Data

(63) Continuation-in-part of application No. 12/111,797, filed on Apr. 29, 2008, now abandoned.

(51) Int. Cl.
*H01L 29/76* (2006.01)
*H01L 29/94* (2006.01)

(52) U.S. Cl. ........ 257/330; 257/331; 257/341; 257/409; 438/270

(58) Field of Classification Search .................. 257/328, 257/330–331, 341, 409, 484, E21.615, E27.081; 438/270

See application file for complete search history.

(56) References Cited

U.S. PATENT DOCUMENTS

| 6,806,548 | B2 * | 10/2004 | Shirai et al. | 257/473 |
| 7,592,650 | B2 * | 9/2009 | Hshieh | 257/226 |
| 2001/0023959 | A1 | 9/2001 | Harada et al. | |
| 2006/0209887 | A1 | 9/2006 | Bhalla et al. | |

* cited by examiner

*Primary Examiner* — Theresa T Doan
(74) *Attorney, Agent, or Firm* — Birch, Stewart, Kolasch & Birch, LLP (57) ABSTRACT

A trench Metal-Oxide-Semiconductor Field Effect Transistor (MOSFET) structure with guard ling, includes: a substrate including an epi layer region on the top thereof a plurality of source and body regions formed in the epi layer; a metal layer including a plurality of metal layer regions which are connected to respective source and body regions forming metal connections of the MOSFET; a plurality of metal contact plugs connected to respective metal layer regions; an insulating layer deposited on the epi layer formed underneath the metal layer with a plurality of metal contact holes therein for contacting respective source and body regions; and a guard ring wrapping around the trench gates with contact metal plug underneath the gate metal layer.

10 Claims, 8 Drawing Sheets

MOSFET STRUCTURE WITH GUARD RING

CROSS REFERENCE

This application is a continuation-in-part of U.S. patent application Ser. No. 12/111,797 filed on Apr. 29, 2008 now abandoned.

BACKGROUND OF THE INVENTION

1. Field of the Invention

The present invention relates to a trench MOSFET structure with a guard ring and the method for manufacturing the same, and more particularly to a structure of a trench MOSFET which solves low breakdown voltage in contacted trench gate area and the method for manufacturing the same.

2. The Prior Arts

In the structure of a trench Metal-Oxide-Semiconductor Field Effect Transistor (MOSFET) or vertical transistor, the gate of the transistor is formed in a trench on top of a substrate and the source/drain regions are formed on both sides of the gate. This type of vertical transistor allows high current to pass through and channel to be turned on/off at a low voltage.

Figure 1:
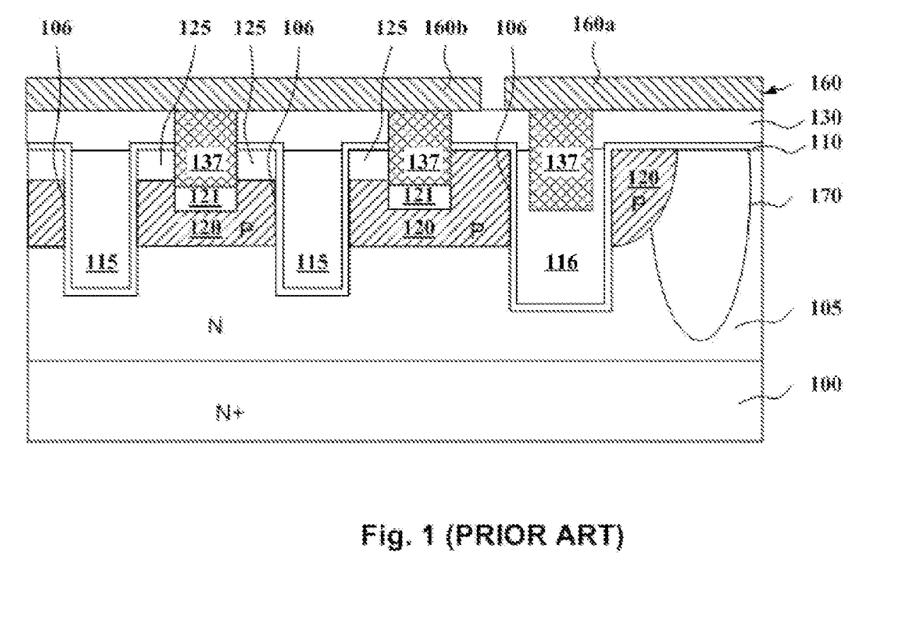
FIG. 1 is a cross-sectional diagram depicting a trench MOSFET structure with a guard ring.

Referring to FIG. 1, a cross-sectional diagram of the structure of a trench MOSFET is shown. An N-type doping epitaxial region 105 is provided on a N+ substrate 100. A plurality of trenches 106 are formed on the N-type doping epitaxial region 105 that has lower doping concentration than the substrate 100. The surface of trenches 106 which is covered a gate oxide layer 110 thereon are filled with a doped polysilicon layer to form a plurality of trenched gates 115. A plurality of P-type doping regions 120 are formed on both sides of the trenched gates 115. A plurality of N+ source regions 125 are formed in the P-type body regions 120. A metal layer 160 is deposited on the top of the MOSFET structure for formation of source metal 160b, and gate metal field plate metal 160a (gate metal 160a also services as field plate metal here) of the MOSFET. An insulating layer 130 is formed on top surface of the epitaxial layer and the trenched gates 115 for insulating. Metal contact plugs 137 are formed in the P-type body regions 120 for connecting source metal 160b, and in a wide trench of the said trenched contact gates 116 for connecting gate metal 160a (The wide trenched contact gate 116 allows metal contact having more tolerance into the doped polysilicon in the wide trench without shorting to the P-type body regions 120 resulted from misalignment). A plurality of P+ heavily-doped regions 121 are formed at the bottom of the metal contact plug 137. The MOSFET structure of the prior arts also has a P-type guard ring 170 which is formed aside the P-type body regions 120 underneath the field plate metal 160a of the MOSFET to increase breakdown voltage in termination. However, the structure in FIG. 1 has low breakdown voltage occurring on trench bottom of the trenched contact gate 116 as result of wider trench which has deeper trench depth than the trench depth in active area. The trench depth is deeper when the trench width is wider because more open area allows more etching gas goes into trench during dry etching silicon process. When reverse bias between drain and gate/source increases, avalanche will first occur on the trench bottom of the trenched contact gate 116 because it has deeper trench gate.

The present invention provides a new structure of trench MOSFET structure with a guard ring wrapped around the contacted trench gate which improves the lack of the prior art.

SUMMARY OF THE INVENTION

This invention provides a trench Metal-Oxide-Semiconductor Field Effect Transistor (MOSFET) with a guard ring. The MOSFET structure with guard ring, comprising: a substrate comprising an epitaxial layer region on the top thereof; a plurality of source and body regions formed between two adjacent trenched gates in active area; a metal layer comprising source metal layer and gate metal layer regions which are respectively connected to source and body regions, and at least a trenched contact gate forming metal connections of the MOSFET; a plurality of metal contact plugs connected to the respective metal layer regions; an insulating layer deposited on the epi layer formed underneath the metal layer with a plurality of metal contact holes filled with the metal contact plugs therein for contacting the source and body regions; and a guard ring wrapping around the trenched contact gates in such a way that a drift region formed between the guard ring and the substrate underneath the trenched contact gate with the largest height located below center of the trenched contact gate.

BRIEF DESCRIPTION OF THE DRAWINGS

The present invention can be more fully understood by reading the following detailed description of the preferred embodiments, with reference made to the accompanying drawings, wherein.

DETAILED DESCRIPTION OF THE PREFERRED EMBODIMENT

The present invention is described by the following specific embodiments. Those with ordinary skills in the arts can readily understand the other advantages and functions of the present invention after reading the disclosure of this specification. The present invention can also be implemented with different embodiments. Various details described in this specification can be modified based on different viewpoints and applications without departing from the scope of the present invention.

Figure 2A:
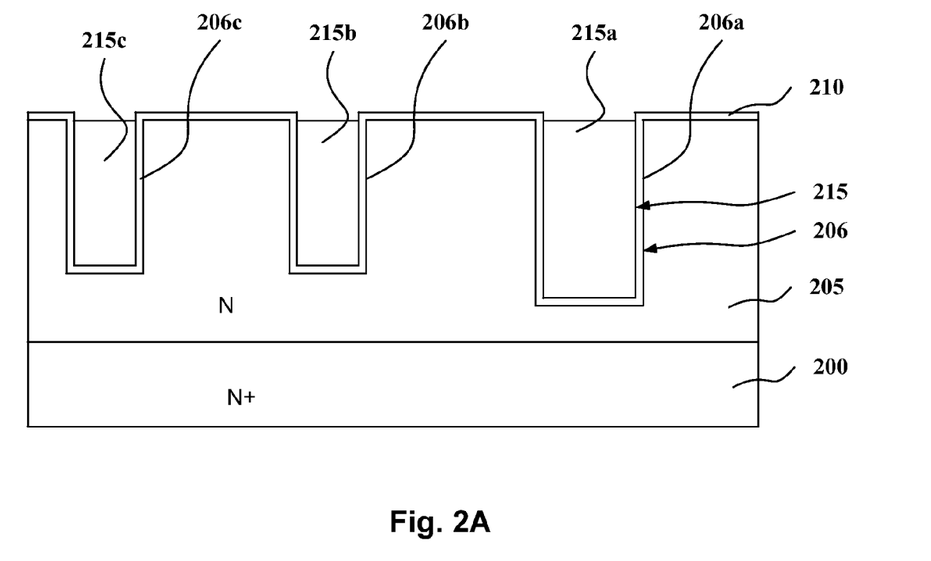
FIGS. 2A-2F are cross-sectional diagrams illustrating forming a trench MOSFET structure with guard ring on a substrate in accordance with an embodiment of the present invention.
Figure 2B:
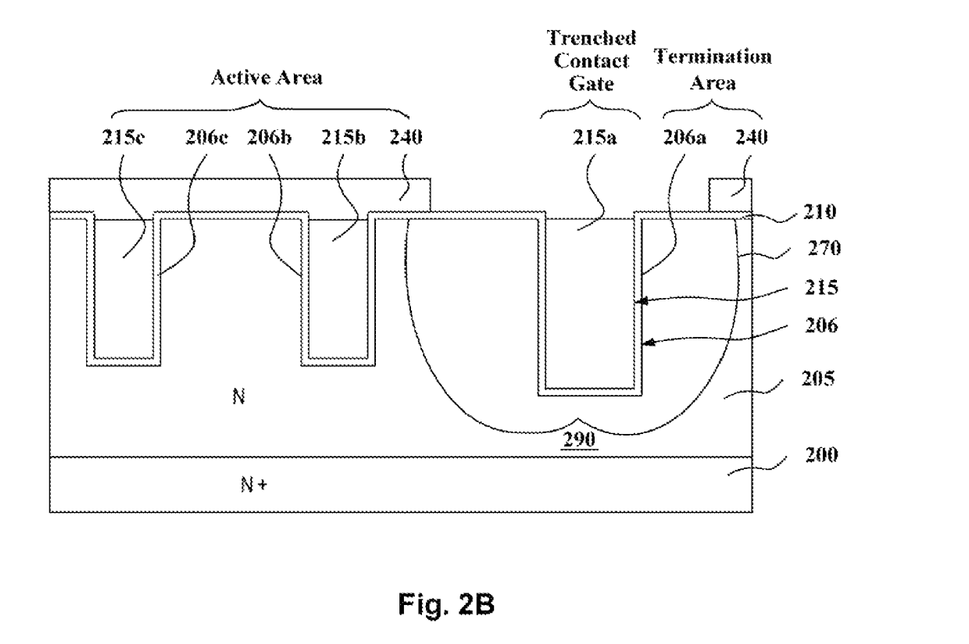
Figure 2C:
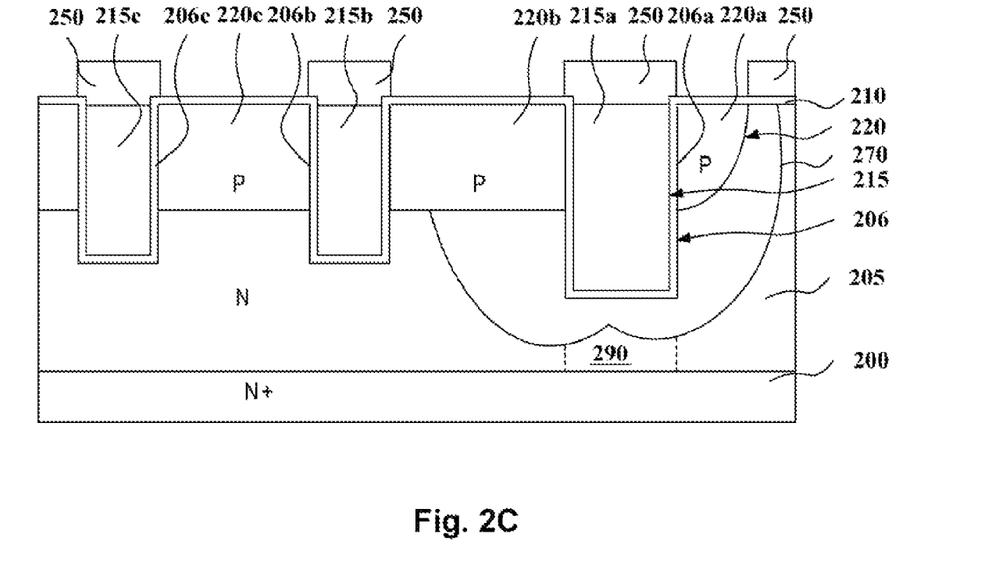
Figure 2D:
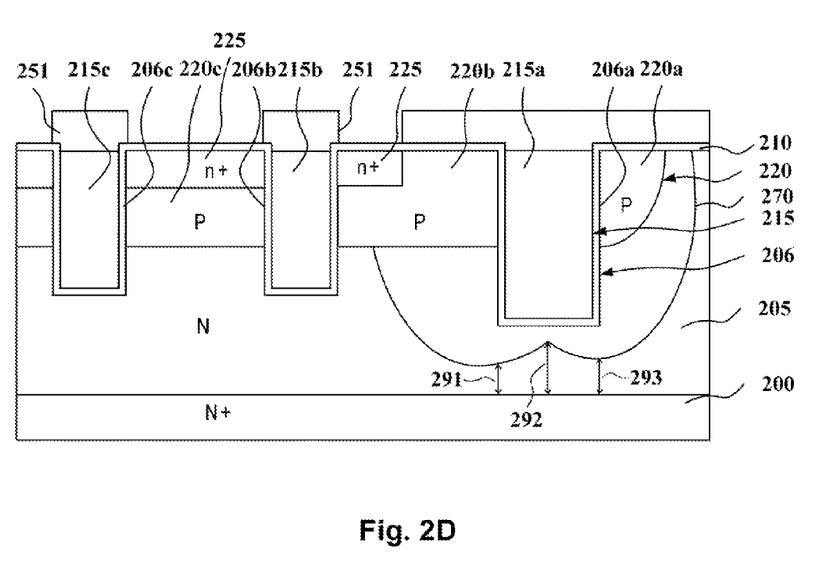
Figure 2E:
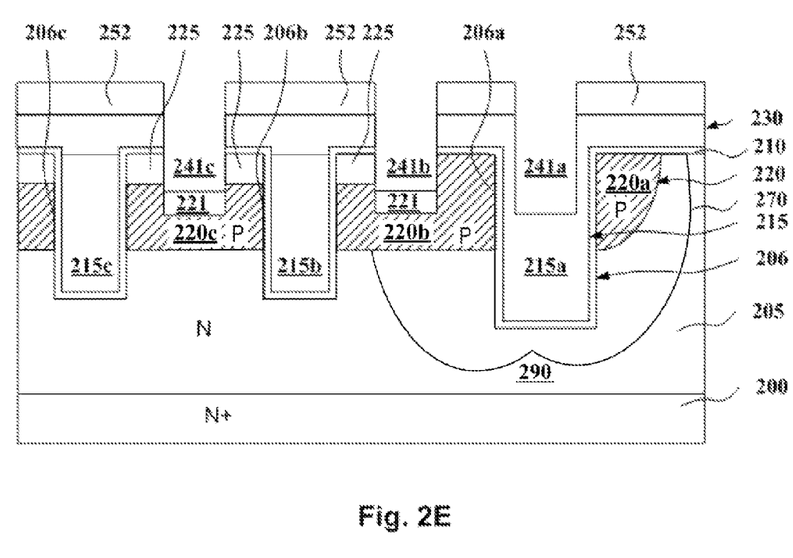
Figure 2F:
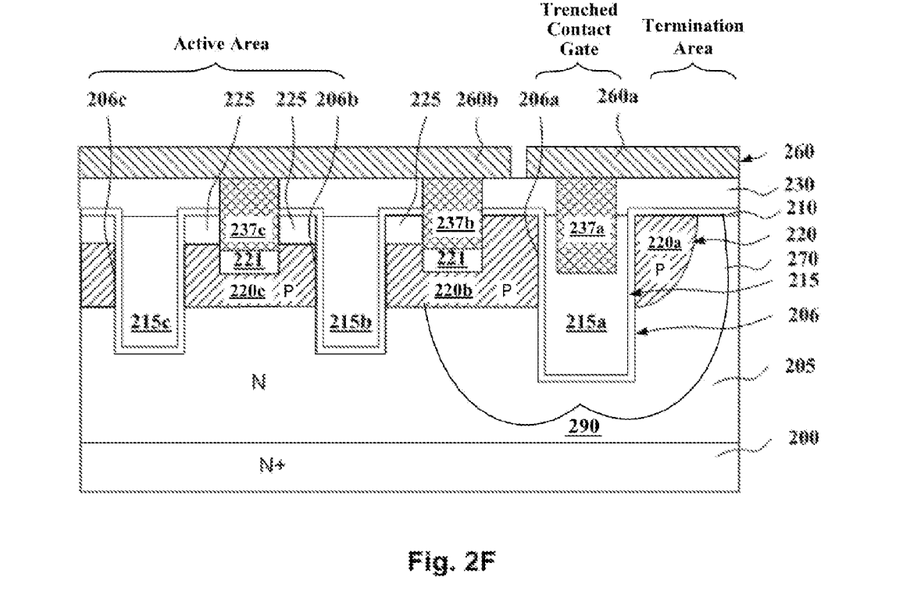

The present invention as shown in FIG. 2F provides a trench MOSFET structure with a guard ring comprising: a substrate of a first conductivity doping type including an epitaxial layer of the first conductivity doping type formed on the top thereof with doping concentration less than the substrate; a plurality of source regions of the first conductivity doping type formed in the epitaxial layer and a plurality of first type body regions of a second conductivity doping type formed beneath the sources in active area; an insulating layer formed on the epitaxial layer; a plurality of first type trenches in the active area vertically penetrating through the insulating layer and the source regions and extending into the body regions, and having an gate oxide layer formed thereon, the first type trenches filled with a doped polysilicon layer as trenched gates for current conduction; at least one second type trench having the gate oxide layer formed thereon, the second type trench being deeper and wider than the first type trench extending from surface of the body regions and into a guard ring region, the second type trench filled with the doped polysilicon as trenched contact gate between the active and termination areas; a first metal contact plug penetrating through the insulating layer and extending into the second type trench, the first metal contact plug being connected to a first metal layer formed on the insulating layer, the first metal contact serving as gate metal in a termination area; a plurality of second metal contact plugs, penetrating through the insulating layer and the source regions, and extending into the body regions, the second metal contact plugs being connected to a second metal layer formed on the insulating layer, the second metal layer serving as source metal; the guard ring formed in the trenched contact gate area, and termination area extending from the top surface of the epitaxial layer having the second conductivity doping type, the guard ring having a junction depth deeper than that of the body region, and the guard ring wraps around sidewall and bottom of the trenched contact gate; the guard ring having doping concentration near the trenched contact gate bottom gradually decreases from sidewall of the trenched contact gate toward center of the trenched contact gate bottom; a drift region of the first conductivity doping formed between the substrate and the guard ring underneath the trenched contact gate with a height of the drift region defined by a distance from the substrate to the guard ring which is greater under center of the trenched contact gate bottom than that under sidewalls of the trenched contact gate; and the gate metal formed above the body region, guard ring and overlapping top surface of the epitaxial layer in the termination area servicing as a metal field plate for breakdown voltage enhancement. a second type body region with said second conductivity doping type formed between said active area and said trenched contact gate; and a third type body region with said second conductivity doping type formed in said termination area.

Figure 3:
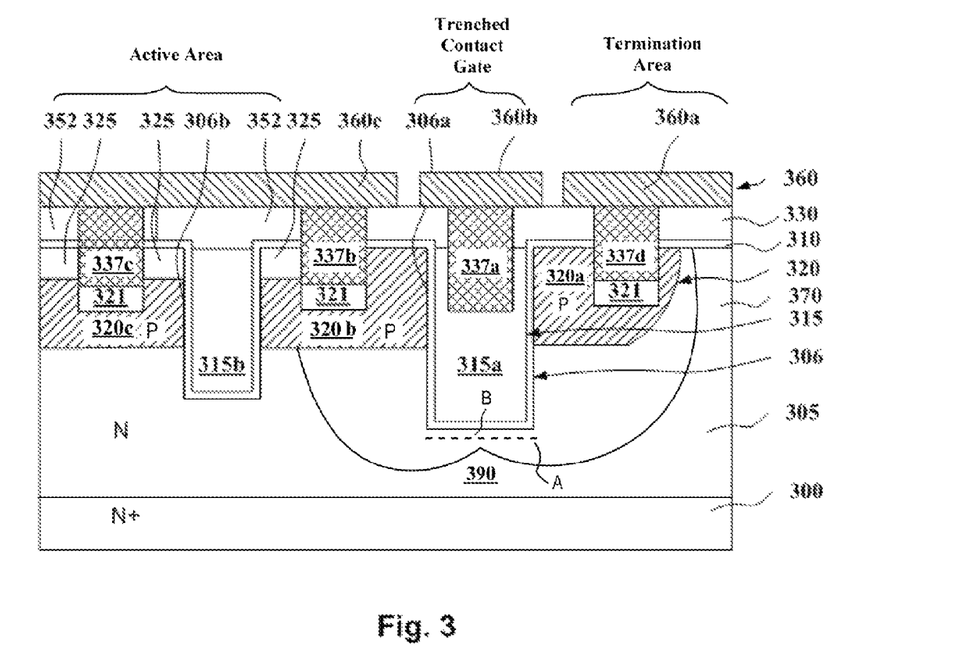
FIG. 3 is a cross-sectional diagram illustrating the trench MOSFET structure with guard ring in accordance with another embodiment of the present invention.

In another embodiment as shown in FIG. 3, the trench MOSFET structure further comprising a plurality of third metal contact plugs penetrating through the insulating layer and extending into the body regions, the third metal contact plugs being connected to a third metal layer formed on the insulating layer, the third metal layer overlapping the body region, the guard ring region and the epitaxial layer serving as a metal field plate for breakdown voltage enhancement.

Referring to FIG. 2A, an N+ doped substrate 200 having a N-type doping epitaxial layer region 205 thereon is provided. Lithography and dry etching processes are performed to form a plurality of trenches 206 in the N-type epi layer 205. The trenches 206 comprise a first type trenches 206b and 206c, a second type trench 206a, and the second type trench 206a is deeper and wider than both of the first type trenches 206b and 206c. Then, a deposition or thermally grown process is performed to form a silicon oxide layer on the surface of the N-type source region 205 and the trenches 206, which acts as a gate oxide layer 210 of a trench MOSFET. Prior to the gate oxide layer 210 is formed, a sacrificial oxide is grown and wet etched for removal silicon damage along the trench 206 surface induced by the dry trench etch. At last, a doped polysilicon layer is formed on the gate oxide layer 210 and filled in the trenches 206 by a deposition process. Thereafter, the doped polysilicon layer on the gate oxide layer 210 is removed by a dry etching process or a CMP (chemical-mechanical polishing process) and the doped polysilicon layer on the each trench 206 is removed by a polysilicon etching back process, and a plurality of gate structures 215 of the trench MOSFET in the trench are formed. The gate structure 215 comprises a first type trenched gates 215b and 215c, and a second trenched gate 215a which are respectively formed in the first type trenches 206b and 206c, and the second trench 206a. The second type trenched gate 215a is used as trenched contact gate for connection of gate metal layer.

Referring to FIG. 2B, a second mask 240 is formed over the gate oxide layer 210 and the gate structure 215 by lithography to define a doping zone. Then, a guard ring 270 are formed in the N-type doping region 205 by an ion implantation and diffusion processes. After processes of forming the guard ring 270, the second mask 240 is removed. The guard ring 270 surrounds the trenched contact gate 215a while the doping zone of the guard ring 270 covers the trenched contact gate 215a with a doping depth of the guard ring 270 deeper than the trenched contact gate 215a. Moreover, a N type drift region 290 (FIGS. 2B and 2C) is formed under the trench contact gate between the substrate 200 and the guard ring 270 with a non-uniform height defined by a distance from the substrate 200 to the guard ring 270. The height of the N type drift region 292 (FIG. 2D) under the center of the trench contact gate 215a is greater than those heights 291 and 293 (FIG. 2D) under sidewall of the trenched contact gate 215a.

Referring to FIG. 2C and FIG. 2D, a third mask 250 is formed to define a plurality of P-body regions 220 formed in the N-type doping epitaxial region 205 by an ion implantation, the third mask 250 removal and diffusion process. The P-body regions 220 include a first type P-body region 220c in active area, a second type P-body region 220b between the active area and the trenched contact gate, and a third type P-body region 220a in termination area. After that, a forth mask 251 (see FIG. 2D) is formed so as to facilitate formation of N+ source regions 225 in the first type P-body region 220c and the second type P-body region 220b by ion implantation and thermal diffusion processes after the forth mask 251 is removed.

Referring to FIG. 2E, an insulating layer 230 is formed on the gate oxide layer 210 and the gate structure 215. This insulating layer 230 is a silicon dioxide layer formed by a deposition process. After the deposition of the insulating layer 230, a fifth mask 252 is formed on the surface of the insulating layer 230 by lithography. This fifth mask 252 defines the locations of metal contacts of the trench MOSFET. Thereafter, a dry etching process is performed by using the fifth mask 252 as the etching mask, such that metal contact holes 241a, 241b, and 241c are formed in the insulating layer 230, the N+ sources regions 225, the P-body regions 220, and the trenched contact gate 215a. The first metal contact holes 241b and 241c are respectively corresponding to the P-body regions 220b and 220c while the second metal contact hole 241a is corresponding to the trenched contact gate 215a. Then, an ion implantation process is carried out to form P+ heavily-doped regions 221 at bottom of contact 241b and 241c.

Referring to FIG. 2F, the metal contact holes 241a, 241b, and 241c can be filled with tungsten metal 237 padded with a barrier metal layer Ti/TiN or Co/TiN to form the metal contact plugs 237a, 237b, and 2371c respectively. Besides tungsten metal, aluminum metal or copper metal is used as the contact plug or the front metal layer of the trench MOSFET. After etch back of the contact metal 237, a metal layer Ti/Aluminum alloys 260 is deposited on the insulating layer 230, the first metal contact plugs 237b and 237c, the second metal contact plug 237a, and the metal layer 260 comprises a first metal layer region 260b and a second metal layer region 260a which are separated and are metal connections of the trench MOSFET. The first metal layer region 260b is corresponding to connection of both the N+ source region 225 and the P-body region 220, and the second metal layer region 260a is corresponding to connection of the trenched contact gate 215a.

Referring to FIG. 2F, the MOSFET structure with guard ring of the present invention has a MOSFET structure comprises the N+ doped substrate 200, the N-type doping epi layer region 205, the plurality of trenches 206, the plurality of gate structure 215, the gate oxide layer 210, the plurality of P-body regions 220, the plurality of P+ heavily-doped regions 221, the plurality of N+ source regions 225, the insulating layer 230, the plurality of metal contact plugs (237a, 237b, and 237c), the metal layer 260, and the guard ring 270. The metal layer 260 comprising the first metal layer region 260b and the second metal layer region 260a are formed on the top of the MOSFET structure, and the first metal layer region 260b and the second metal layer region 260a are formed as the source metal, and the gate and field plate metal of the MOSFET, respectively. The gate structure 215 comprising the first type trenched gates 215b and 215c, and the second trenched gate as trenched contact gate 215a which are covered the gate oxide layer 210 and are filled in the trenches 206 to be used as the gate of the MOSFET. The insulating layer 230 is formed between the metal layer 260 and the gate structure 215 for insulating, and the metal contact plugs 237a, 237b, and 237c are penetrated through the insulating layer 230 and contacted with the metal layer 260. Although the MOSFET structure of the present invention has the partial structure which is similar to prior arts, the guard ring 270 is particularly different from the prior arts. The guard ring 270 wraps around the trenched contact gate 215a while the second metal layer region 260a of the metal layer 260 covers the second contact plug 237a and the trenched contact gate 215a. The P+ heavily-doped regions 221 are formed at the bottom of the first type trenched gates 215b and 215c.

Referring to FIG. 2F again, according to the embodiment said above, the guard ring 270 can wrap around the trenched contact gate 215a, a part of the second type P-body region 220b between the active area and termination area and the third type P-body region 220a in termination area while the first metal layer region 260b and the second metal layer region 260a of the metal layer 260 covers the first metal contact plugs 237b and 237c, and the second contact plug 237a, respectively.

Referring to FIG. 3, a second embodiment of the present invention, the MOSFET structure with guard ring of the present invention is similar to the first embodiment of the present invention and has a MOSFET structure comprises a N+ doped substrate 300, a N-type doping epi layer region 305, a plurality of trenches 306, a plurality of gate structure 315, a gate oxide layer 310, a plurality of P-body regions 320, a plurality of P+ heavily-doped regions 321, a plurality of N+ source regions 325, a insulating layer 330, a plurality of contact metal plugs (337a, 337b, 337c, and 337d), multiple metal layer 360, and a guard ring 370. The metal layer 360 comprising a first metal layer region 360c, a second metal layer region 360b, and a third metal layer 360a is formed on the top of the MOSFET structure, and the first metal layer region 360c, the second metal layer region 360b, and the third metal layer 360a are formed as the source metal, the gate metal, and the field plate metal of the MOSFET respectively. The gate structure 315 comprises the first type trenched gate 315b, and the second gate 315a which are covered the gate oxide layer 310 and are filled in the trenches 360 to be used as a gate of the MOSFET. The insulating layer 330 is formed between the metal layer 360 and the gate structure 315 for insulating, and the metal contact plugs 337a, 337b, 337c, and 337d penetrate through the insulating layer 330 and contacted with the metal layer 360 respectively. The guard ring 370 is particularly different from the prior arts. the guard ring 370 can wrap around the trenched contact gate 315a, a part of the second type P-body region 320b between the active area and termination area and the third type P-body region 320a in termination area while the first metal layer region 360c and the second metal layer region 360b of the metal layer 360 covers the first metal contact plugs 337b and 337c, and the second metal contact plug 337a, respectively. Moreover, the guard ring having doping concentration near the trenched contact gate bottom gradually decreases from sidewall of the trenched contact gate toward center of the trenched contact gate bottom. The doping concentration at point A in FIG. 3 is higher than that at point B.

Referring to FIG. 3 again, according to the embodiment said above, the guard ring 370 can wrap around the trenched contact gate 315a, a part of the second type P-body region 320b between the active area and termination area and the third type P-body region 320a in termination area while the first metal layer region 360c and the second metal layer region 360b and the third metal layer region 360a of the metal layer 360 covers the first metal contact plugs 337b and 337c, the second metal contact plug 337a and third metal contact plug 337d, respectively.

Although various embodiments are specifically illustrated and described herein, it will be appreciated that modifications and variations of the present invention are covered by the above teachings and are within the purview of the appended claims without departing from the spirit and intended scope of the invention.

What is claimed is:

1. A trench MOSFET structure with a guard ring, comprising:
    a substrate of a first conductivity doping type including an epitaxial layer of said first conductivity doping type formed on said substrate, said epitaxial layer having a doping concentration less than that of said substrate;
    a plurality of source regions of said first conductivity doping type formed in said epitaxial layer, and a plurality of first type body regions of a second conductivity doping type formed beneath said sources in an active area;
    an insulating layer formed on said epitaxial layer;
    a plurality of first type trenches in said active area vertically penetrating through said insulating layer and said source regions, and extending into said body regions, said first type trenches having an gate oxide layer formed thereon, said first type trenches being filled with a doped polysilicon layer as trenched contact gates for current conduction;
    a guard ring being formed in said trenched contact gate area and said termination area, said guard ring extending from a top surface of said epitaxial layer having said second conductivity doping type, said guard ring having a junction depth deeper than that of said body region, and said guard ring wrapping around a sidewall and a bottom of said trenched contact gate;
    at least one second type trench having said gate oxide layer formed thereon, said second type trench being deeper and wider than said first type trench, said second type trench extending from a surface of said body regions into said guard ring region, said second type trench being filled with said doped polysilicon as a trenched contact gate between said active area and a termination area;
    said guard ring having doping concentration gradually decreasing from a sidewall of said second type trenched contact gate toward a center of said bottom of said second type trenched contact gate;
    a drift region of said first conductivity doping being formed between said substrate and said guard ring, and formed underneath said second type trenched contact gate, a height of said drift region under said center of said bottom of said second type trenched contact gate being greater than those heights of said drift region under said sidewall of said second type trenched contact gate, the height of said drift region being defined by a distance from said substrate to said guard ring;

a second type body region with said second conductivity doping type formed between said active area and said trenched contact gate; and a third type body region with said second conductivity doping type formed in said termination area.

2. The trench MOSFET structure in claim 1, further comprising a first metal contact plug penetrating through said insulating layer and extending into said doped polysilicon filled in said second type trenched contact gates, a first metal contact plug being connected to said first metal layer formed on said insulating layer, said first metal contact plug serving as a gate metal; and a plurality of second metal contact plugs penetrating through said insulating layer and said source regions, and extending into said body regions, said second metal contact plugs being connected to a second metal layer formed on said insulating layer, said second metal layer serving as a source metal.

3. The trench MOSFET structure in claim 2, wherein said gate metal formed above said third type body region and guard ring and overlapping top surface of said expitaxial layer in said termination area servicing as a metal field plate for breakdown voltage enhancement.

4. The trench MOSFET structure in claim 1, further comprising a plurality of third metal contact plugs penetrating through said insulating layer and extending into said third type body region, said third metal contact plugs being connected to a third metal layer formed on said insulating layer, said third metal layer overlapping said third type body region, said guard ring region and said epitaxial layer serving as a metal field plate for breakdown voltage enhancement.

5. The trench MOSFET structure in claim 1, further comprising a plurality of heavily-doped regions of said second conductivity doping type disposed at the bottoms of said second metal contact plugs.

6. The trench MOSFET structure in claim 4, further comprising a plurality of heavily-doped regions of said second conductivity doping type disposed at the bottoms of said third metal contact plugs.

7. The trench MOSFET structure in claim 1, wherein said guard ring wraps around a part of said second type body region between said active and said trenched contact gate and said third type body region in termination area.

8. The trench MOSFET structure in claim 1, wherein said gate oxide layer in trench gates is single oxide of which oxide thickness nearly uniform along the trench sidewall and bottom.

9. The trench MOSFET structure in claim 1, wherein said gate oxide layer at the bottoms of trench gates has a significant larger thickness than the trench sidewall so as to reduce the capacitance of the gate oxide layer.

10. The trench MOSFET structure in claim 1, wherein said guard ring having doping concentration near said trenched contact gate bottom gradually decreases from sidewall of said trenched contact gate toward center of said trenched contact gate bottom.

* * * * *